United States Patent [19]

Kubo

[11] Patent Number: 4,614,563

[45] Date of Patent: Sep. 30, 1986

[54] PROCESS FOR PRODUCING MULTILAYER CONDUCTOR STRUCTURE

[75] Inventor: Takashi Kubo, Kaisei, Japan

[73] Assignee: Fuji Photo Film Co., Ltd., Kanagawa, Japan

[21] Appl. No.: 760,034

[22] Filed: Jul. 29, 1985

[30] Foreign Application Priority Data

Aug. 2, 1984 [JP] Japan ................................ 59-163620

[51] Int. Cl.⁴ .......................... C23F 1/02; B44C 1/22; C03C 15/00; C03C 25/06
[52] U.S. Cl. .................................. 156/643; 156/652; 156/656; 156/659.1; 156/668; 204/192 EC; 204/192 E; 204/192.32; 204/192.15; 360/110
[58] Field of Search ............... 156/643, 646, 652, 655, 156/656, 659.1, 661.1, 668; 204/164, 192 EC, 192 E; 360/110, 122, 123; 29/603

[56] References Cited

U.S. PATENT DOCUMENTS 3,671,312 6/1972 Murakami et al. ............. 156/630 X
4,119,483 10/1978 Hubsch et al. ................... 156/668 X
4,239,587 12/1980 Koel et al. ...................... 156/656 X
4,501,060 2/1985 Frye et al. ........................ 29/576 W

FOREIGN PATENT DOCUMENTS 0018062 2/1980 Japan ................................... 156/657

Primary Examiner—William A. Powell
Attorney, Agent, or Firm—Gerald J. Ferguson, Jr.; James E. Bryan; Michael P. Hoffman

[57] ABSTRACT

A process for producing a multilayer conductor structure having at least two conductor patterns in layers and a smooth surface over the upper pattern, which comprises the steps of:

(1) forming a first conductor pattern on a substrate or a layer provided on the substrate;
(2) providing a conductor layer over an intermediate insulation layer formed on said first conductor pattern;
(3) providing a resin layer on said conductor layer to form a smooth surface thereover; and
(4) etching said resin layer and a part of said conductor layer provided on the first conductor pattern to form a second conductor pattern having a smooth surface thereon.

6 Claims, 2 Drawing Figures

PROCESS FOR PRODUCING MULTILAYER CONDUCTOR STRUCTURE

BACKGROUND OF THE INVENTION

1. Field of the Invention

The present invention relates to a process for producing a multilayer conductor structure and more particularly, to a process for producing a multilayer conductor structure which comprises multilayer conductor patterns and has a smooth surface.

2. Description of Prior Arts

In recent years, various elements have been fabricated utilizing the micropatterns of thin films and used in the fields of electronics and optics. This is based on the recent development of thin film-forming technique, photo-lithography and etching technique. Examples of such elements include semiconductor elements such as IC and LSI, liquid crystal display elements, thin-film magnetic heads and thermal heads.

It is desired that thin-film magnetic recording heads used in magnetic recording devices such as VTR, digital-recording audiotape device and magnetic disk device be more smaller and have higher performance to compensate for the miniaturization of the devices. Particularly, the development of a magnetic head having a shorter gap length and a narrower track width is desired to enable higher density-recording. Further, it is required that the magnetic head has a higher magnetomotive force. In order to meet such requirements, the magnetic head should be of a multi-turn type and the efficiency of its magnetic circuit should be higher.

The thin-film magnetic head for magnetic recording has a basic structure which comprises a substrate such as a glass substrate or a sapphire substrate, an upper magnetic pole and a lower magnetic pole provided thereon, both being composed of a film of magnetic substance such as permalloy or sendust, and a coil composed of conductor such as Al, Cu or Au provided between the poles with insulation layers therethrough. The magnetic head is fabricated, for example, by repeating the following steps in turn: steps of forming a film of the magnetic substance and forming an insulation layer or a conductor film on the substrate by a known film-forming processes such as sputtering, vapor deposition and plating, a step of patterning the upper layer by means of resist, and a step of producing a thin film pattern by chemical ethching or dry etching, thereby to provide a lower magnetic pole, an upper magnetic pole, an electrical insulation layer, a coil, a front gap, etc., superposed in this order.

In the fabrication of an element comprising such thin film patterns in multilayer structure, a profile of recess and protrusion (steps) corresponding to the thin film pattern is liable to appear on the upper thin film even where an intermediate insulation layer is provided therebetween. This causes lowering in the precision of the lithography of thin film pattern provided on an upper layer and results in decreasing the characteristics of the resulting element.

Particularly in the fabrication of a multi-turn type thin-film magnetic head having a multilayer coil, conductor patterns serving as the coils are so laminated in the form of a multilayer that there is a difficulty in forming conductor patterns in the upper part with high accuracy, and head efficiency (recording and reproducing efficiency) is liable to lower. Further, the appearance of a profile of recess and protrusion corresponding to these coil patterns on the upper magnetic pole causes increase of magnetic resistance of the resulting magnetic head and partial shortening of a distance between the upper and the lower magnetic poles in the recessed area. This causes leakage of magnetic flux, and also results in lowering of head efficiency.

Accordingly, the formation of recess and protrusion on the surface of the upper thin film corresponding to the lower patterns in multilayer structure should be prevented in fabricating the element such as the thin-film magnetic head.

Further, the elements including the above-described magnetic head should be as small in size and thickness as possible. The multilayer coil is desired to have a higher density so as to show high magnetomotive force.

There have been proposed a variety of methods of forming a multilayer structural thin film pattern having a smooth surface thereon in the production of the multilayer coil in order to solve the aforementioned problems. For example, there is known a method in which an insulation layer is provided on the first conductor pattern and then the second pattern is formed on the insulation layer by a lift-off process or a bevel etching (chemical etching) process.

The lift-off process comprises steps of providing a layer of a lift material on the insulation layer; etching the lift material layer to form the same micropattern as that of the first conductor pattern; forming a conductor film having the same thickness as that of the first pattern on the lift material layer and the insulation layer; and removing (lifting off) the lift material layer together with the conductor thereon by a stripping agent to form the second pattern in the recessed area of the first pattern. In this process, V-shaped ditches are produced between the insulation layer and the second pattern in this process so that the surface can be hardly smoothed. Further, the process has disadvantages in that strict alignment is required in the etching step and further a treating stage for removing the lift material is complicatd.

The bevel etching process comprises providing a conductor film having the same thickness as that of the first conductor pattern on the insulation layer; further providing a photoresist layer thereon; etching the area corresponding to the central part of a protrusion of the first pattern to form a resist pattern; subjecting the protrusion of the conductor film to a bevel etching treatment under prescribed etching conditions by utilizing the resist pattern; and removing the resist to form the second pattern in the recessed area of the first pattern. This method has disadvantages in that alignment for forming the resist pattern is not easy, the suitable etching conditions can be hardly chosen and as a result, inverse V-shaped protrusions are left in the second pattern so that it is difficult to form a perfectly smooth (flat) surface.

SUMMARY OF THE INVENTION

The inventor has made studies to solve the problems in the conventional processes for producing the multilayer conductor structures, particularly the multilayer coil of the thin-film magnetic head. The inventor has found that the above-described disadvantages can be solved or reduced when a resin layer is provided on a conductor film for forming the second pattern to form a smooth (flat) surface, said conductor film being provided over an intermediate insulation layer on the first pattern to have a profile of recess and protrusion corresponding to that of the first pattern, and then etching the resin layer and the protrusion of the conductor film at the same rate, to form a second pattern having a smooth surface thereon. The present invention is based on this finding.

An object of the present invention is to provede a process for producing a multilayer conductor structure, which is free from the disadvantages associated with the conventional processes.

The present invention provides a process for producing a multilayer conductor structure having at least tow conductor patterns in layers and a smooth surface over the upper pattern, which comprises the steps of:

(1) forming a first conductor pattern on a substrate or a layer provided on the substrate;
(2) providing a conductor layer over an intermediate insulation layer formed on said first conductor pattern;
(3) providing a resin layer on said conductor layer to form a smooth surface thereover; and
(4) etching said resin layer and a part of said conductor layer provided on the first conductor pattern to form a second conductor pattern having a smooth surface thereon.

In the process for producing the multilayer conductor structure according to the present invention, the multilayer structural conductor pattern can be formed with high accuracy without requiring an operation for complicated alignment corresponding to the first conductor pattern and at the same time, the resulting surface can be smoothed, by properly chosening the resin to be used, the etching method and the etching conditions.

Further, since the patterning by means of the resist is not necessary, the stage for forming the upper (second) conductor pattern can be greatly simplified and this stage requires no skilled technique.

Particularly, a high-density coil can be produced by forming the second conductor pattern so as to fill up the recessed area of the first conductor pattern therewith in the production of the multilayer coil of the thin-film magnetic head. Further, the resulting second conductor pattern has a smooth surface thereon, so that a multilayer structural coil composed of three or more layers and surface-smoothed can be easily produced by repeatedly performing the operation according to the present invention.

DETAILED DESCRIPTION OF THE INVENTION

The present invention will be described in more detail by referring to the accompanying drawings.

Figure 1:
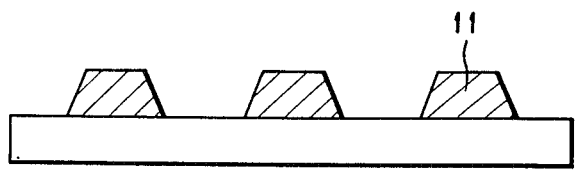
FIG. 1 illustrates the manufacturing process of a multilayer conductor structure according to the present invention.
Figure 1:
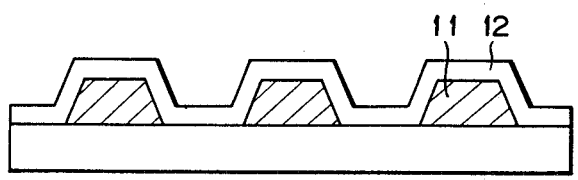
Figure 1:
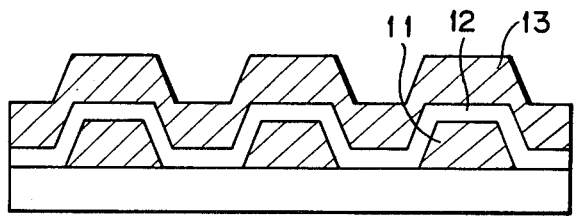
Figure 1:
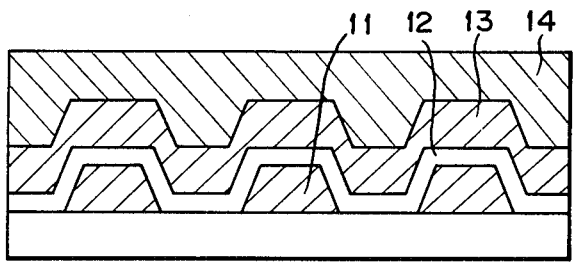
Figure 1:
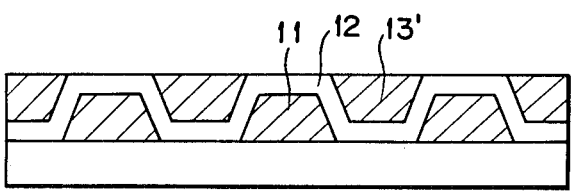

In FIG. 1, (a) to (e) are sectional views illustrating a preferred embodiment of the manufacturing process of a multilayer conductor structure according to the invention.

A conductor such as one made of Al, Cu, Au or permalloy is formed on a substrate or a layer (e.g. a layer having magnetic or electrical function such as magnetic pole) provided on the substrate, for example by sputtering. The thickness of the conductor layer is preferably within the range of 0.5 to 8 $\mu$m. The conductor layer is subjected to an etching treatment using a resist pattern to form the first conductor pattern 11 [FIG. 1(a)].

An intermediate insulation layer 12 composed of an insulation material such as $SiO_2$ is provided on the first conductor pattern 11 [FIG. 1(b)]. Further, a conductor is formed on the layer 12 at the thickness equal to or greater than that of the first pattern 11 in the same manner as described above. The surface of the conductor layer 13 has a profile of recess and protrusion (step) corresponding to that of the first pattern 11 [FIG. 1(c)].

Subsequently, the surface of the conductor layer 13 is coated with a resin, for example, by means of spin coating to form a resin layer 14, whereby forming a smooth surface thereon [FIG. 1(d)]. The thickness of the resin layer varies depending on the level (difference) between the recess and the protrusion (i.e., height of step) on the conductor layer 13, namely that of the first conductor pattern 11, and is preferably in the range of 1 to 20 $\mu$m in the recessed area.

Examples of the resin which can be used for the formation of the resin layer of the invention include quinone diazide photoresists and polyimides (PIQ). Examples of the quinone diazide photoresists include AZ-1300 series such as AZ-1350J, AZ-1370 and AZ-1375; and AZ-1400 series such as AZ-1450J and AZ-1470 (available from Hoechst Corp.). The resin is chosen according to the nature of the lower conductor layer, the etching method and the etching conditions such that the resin and the conductor of the lower layer can be etched at the same rate. The resins are by no means limited to those described above, and any resins can be used so long as they can be etched at the same rate as that of the lower conductor layer.

The etching of the resin layer 14 and the protrusion of the conductor layer 13 (i.e., the resin layer and the conductor existing over the first conductor pattern) is then carried out. As the etching method, for example, etching with ion milling (ion-beam etching) and sputter etching can be employed.

The ion-beam etching can be conducted in such a manner that the surface of the resin layer is irradiated with inert $Ar^+$ ion-beam at a constant incidence angle. It is necessary to set the incidence angle of ion-beam so that the etching rate of both the resin layer and the lower conductor layer are made equal as far as possible to allow the resin part and the conductor part to be etched by the same thickness.

The sputter etching can be conducted in such a manner that an inert Ar gas is ionized by glow discharge, etc. and then irradiates the surface of the resin layer. In this method the discharged ion has neither directional property nor selectivity of the etching rates for materials and hence, different materials as described above can be etched at the same etching rate.

The etching is continued until the surface of the intermediate insulation layer 12 is exposed [FIG. 1(e)], thus forming the second conductor pattern 13'.

The process for producing the multilayer conductor structure according to the present invention can be applied to the fabrication of the aforementioned thin-film magnetic head and semiconductor elements which require micropattern processing technique. Particularly, the process of the invention is suitably employed for forming a multilayer coil in the fabrication of a multi-turn type thin-film magnetic head.

The following example will further illustrate the present invention.

EXAMPLE (1) Determination of the incidence angle in ion-beam etching.

A Cu film of approx. 5 μm in thickness was formed on a sapphire substrate by sputtering to prepare a sample.

An ion-beam etching was then carried out in such a manner that the surface of the sample was irradiated with Ar+ ion-beam generated from Kaufmann type ion source using an inert Ar gas with changing the incidence angle (i.e., angle to the perpendicular line of the plane) from 0° to 80°. The etching conditions were as follows; the initial vacuum degree: $1.5 \times 10^{-6}$ Torr or above, the vacuum degree after introducing Ar gas: $5 \times 10^{-4}$ Torr, the ion accelerating voltage: 0.95 KV, the ion current density: 0.58 mA/cm$^2$. The etching rate of Cu was measured.

Another sapphire substrate was coated with quinone diazide photoresist (AZ-1350J; available from Hoechst Corp.) at the thickness of approx. 5 μm by spin coating, and baked at 130° C. for 30 minutes to prepare a sample. The surface of the sample was subjected to an etching treatment with Ar+ ion-beam in the same manner as described above. The etching rate of the photoresist was measured.

The above-described procedure was repeated with the exception that each of Al, Au and permalloy (Ni-Fe alloy) was used in place of Cu to prepare a sample. The ion-beam etching was carried out in the same manner as described above and each etching rate was measured.

Figure 2:
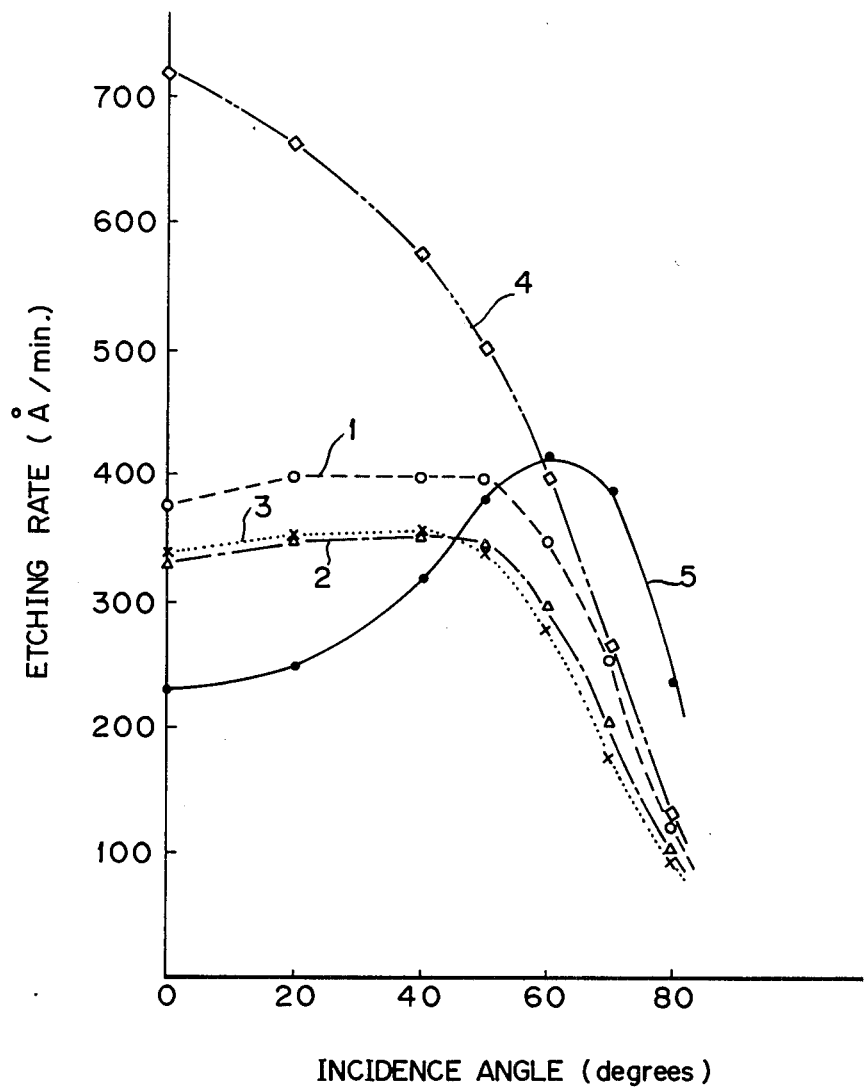
FIG. 2 is a graph showing the relationship between incidence angle of ion-beam and etching rate, wherein the ordinate represents the etching rate and the abscissa represents the incidence angle of ion-beam.

The results are shown in FIG. 2.

FIG. 2 is a graph showing the relationship between the incidence angle of ion-beam and the etching rate for each of Cu, Al, Au, permalloy and photoresist, wherein the etching rate is plotted as ordinate and the incidence angle as abscissa. In FIG. 2, Curves 1 to 5 indicates;

Curve 1: Cu,
Curve 2: Al,
Curve 3: permalloy,
Curve 4: Au,
Curve 5: photoresist (AZ-1350J).

It is evident from the results shown in FIG. 2 that the etching rate of the photoresist (AZ-1350J) with Ar+ ion-beam is greatly affected by the incidence angle thereof. When the incidence angle of Ar+ ion-beam is about 50°, the etching rate of Cu is equal to that of the photoresist. The etching rates of Al and permalloy are equal to that of the photoresist at the incidence angle of about 45°, and the etching rate of Au is equal to that of the photoresist at about 60°.

(2) Production of multilayer coil

A film of Cu conductor was formed on a sapphire substrate by sputtering process. The conductor layer was coated with positive-type photoresist (AZ-1350J; available from Hoechst Corp.), exposed to light through a positive-type photomask, and then subjected to patterning with etching to form a coil pattern in which the thickness of protrusion was 2 μm, line width was 5 μm and the gap between lines was 5 μm. A film of SiO$_2$ was formed on the Cu coil pattern (the first conductor pattern) by sputtering process to provide an insulation layer of 1 μm in thickness.

A 2 μm thick film of Cu conductor was then formed by sputtering in the same manner as described above. On the Cu conductor layer, photoresist (AZ-1350J; available from Hoechst Corp.) was coated by spin coating and baked at 130° C. to give a layer at thickness of 5 μm, whereby a smooth (flat) surface was proveded.

The surface of the photoresist layer was subjected to the ion-beam etching for about 80 minutes by irradiating it with Ar+ ion-beam at an incidence angle of 50° under the same conditions as those described above. The etching was continued until the SiO$_2$ insulation layer was exposed, whereby a Cu coil pattern (the second conductor pattern) was formed. The resulting surface was smooth and it was observed that the pattern composed of Cu and SiO$_2$ was clearly developed on the surface.

As illustrated above, a multilayer coil having a smooth surface can be easily produced by the process of the present invention. Accordingly, the accuracy of conductor film formation and micropattern processing in the subsequent stages can be heightened. The resulting conductor magnetic head is a head having a planar structure with very high accuracy. The planar structure makes it possible to easily fabricate a multilayer structural head. The non-appearance of the recessed area makes the head free from the language of magnetic flux in the recessed area of the upper magnetic pole, which was a problem in conventional, and hence, the head efficiency is greatly increased.

I claim:

1. A process for producing a multilayer conductor structure having at least two conductor patterns in layers and a smooth surface over the upper pattern, which comprises the steps of:
   (1) forming a first conductor pattern on a substrate or on a layer provided on the substrate;
   (2) providing a conductor layer over an intermediate insulation layer formed on said first conductor pattern;
   (3) providing a resin layer on said conductor layer to form a smooth surface thereon; and
   (4) etching said resin layer and a part of said conductor layer provided on the first conductor pattern to form a second conductor pattern having a smooth surface thereon.

2. The process for producing a multilayer conductor structure as claimed in claim 1, wherein said conductor layer provided over the intermediate insulation layer has a thickness equal to or greater than that of the first conductor pattern, the said conductor layer has a step of a height in the range of 0.8 to 8 μm, and the thickness of said resin layer is in the range of 1 to 20 μm in the recessed area.

3. The process for producing a multilayer conductor structure as claimed in claim 1, wherein said conductor is of a conductive metal composed of Cu, Al, Au, an alloy thereof or permalloy and said resin layer is of a quinone diazide photoresist.

4. The process for producing a multilayer conductor structure as claimed in claim 1, wherein said etching is performed by ion-beam etching or sputter etching.

5. The process for producing a multilayer conductor structure as claimed in claim 1, wherein the steps (1) to (4) are repeated at least twice.

6. The process for producing a multilayer conductor structure as claimed in any of claims 1 to 5, wherein said multilayer conductor structure is a multilayer coil of a thin-film magnetic head.

* * * * *